United States Patent [19]

Zook

[11] 4,251,570

[45] Feb. 17, 1981

[54] COLD SUBSTRATE GROWTH TECHNIQUE FOR SILICON-ON-CERAMIC

[75] Inventor: J. David Zook, Dakota, Minn.

[73] Assignee: Honeywell Inc., Minneapolis, Minn.

[21] Appl. No.: 95,729

[22] Filed: Nov. 19, 1979

[51] Int. Cl.³ .................. B05D 1/18; B05D 5/12; B05D 1/36

[52] U.S. Cl. .................. 427/74; 427/75; 427/265; 427/266; 427/462; 427/443.2

[58] Field of Search .................. 427/74, 75, 265, 266, 427/402, 443.2

[56] References Cited

U.S. PATENT DOCUMENTS

| | | | |
|---|---|---|---|
| 4,112,135 | 9/1978 | Heaps et al. | 427/74 X |
| 4,128,680 | 12/1978 | Heaps et al. | 427/74 X |
| 4,137,355 | 1/1979 | Heaps et al. | 427/446 X |

Primary Examiner—James R. Hoffman

Attorney, Agent, or Firm—Omund R. Dahle

[57] ABSTRACT

The present invention is an improvement to the method of growing silicon films on a substrate by bringing the substrate in contact with molten silicon. The improved growth technique may be classified as an asymmetric mode of growth of silicon on the substrate and is characterized by the substrate being maintained at a lower temperature than the solidification of silicon in the area of the substrate where the silicon layer growth is taking place, that is in the area of the liquid-solid interface. The lower temperature of the substrate, say 5°–10° C. below the freezing temperature of silicon, causes the liquid-solid interface to be tilted to be nearly parallel to the substrate surface but inclined at a reentrant angle, so that the leading edge of the crystallization front is on the substrate. This provides an advantage of increased growth speed.

6 Claims, 7 Drawing Figures

– 4,251,570 –

COLD SUBSTRATE GROWTH TECHNIQUE FOR SILICON-ON-CERAMIC

BACKGROUND AND SUMMARY OF THE INVENTION

The present invention is related to the art of growing silicon films on ceramic substrates by bringing the substrate in contact with molten silicon. The present invention is broadly related to prior art U.S. Pat. Nos. 4,112,135, 4,128,680 and 4,137,355 by Joseph D. Heaps and Obert N. Tufte, all assigned to the same assignee as the present invention, where there is described apparatus and method of coating ceramic bodies or sheets with molten silicon to prepare large area, thin sheets of large grain polycrystalline silicon on inexpensive ceramic substrate for use in solar cell panels and the like. This is referred to as silicon-on-ceramic or supported growth techniques. In that method the side of the ceramic sheet or the area to be coated with silicon is first carbon-coated. It is taught in the cited references that when a ceramic (which normally is not wet by molten silicon) is first carbon-coated on a surface to be silicon coated, the carbon-coated surface will then be wet by molten silicon, and by contacting the carbon-coated ceramic substrate with molten silicon, a silicon coating will be formed thereon. The present invention is also generally related to copending application Ser. No. 79,844, filed Sept. 28, 1979 and assigned to the same assignee as the present invention.

The present invention is also directed to growth of sheet silicon on a substrate, specifically to a method called "cold substrate growth". By the term cold substrate growth is meant growth of sheet semiconductor (e.g. silicon) under conditions such that the latent heat of freezing is conducted directly to the substrate, through the previously solidified solid.

The improved growth technique lies in what may be described or classified as an asymmetric mode of growth of the silicon-on-ceramic in contrast with the symmetrical mode of growth occurring in the process of the prior art patents cited above. This asymmetric mode of growth of silicon on the substrate is so classified because the substrate must remain cooler (i.e. at a temperature cooler than the solidification temperature of silicon) in the area of the substrate where the silicon layer growth is taking place so that the liquid-solid interface is nearly parallel to the substrate, but inclined as an angle, so the leading edge of the crystallization front (the first liquid to solidify) solidifies on the substrate.

DESCRIPTION

Figure 1:
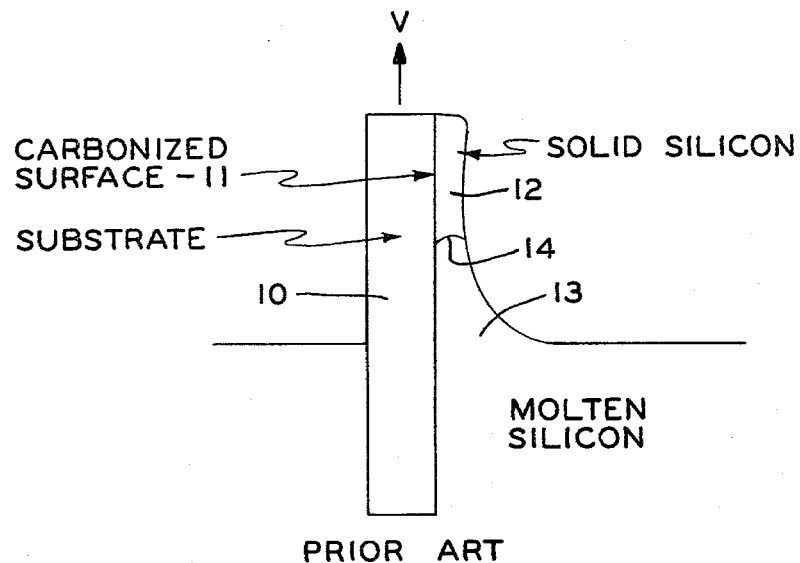
FIG. 1 is a drawing of prior art vertical supported symmetrical silicon growth.

In the prior art relating to coating silicon-on-ceramic from the melt there is taught the method of contacting a carbon-coated surface of a ceramic substrate with molten silicon to form a silicon coating on the carbon-coated ceramic surface. One specific method of contacting the ceramic substrate with molten silicon described in these prior art patents is by dip coating. Referring now to FIG. 1 which shows a prior art process for providing a supported growth of large grain polycrystalline silicon on a ceramic substrate, there is shown a substrate of ceramic 10 having a surface 11 which has been carbon-coated (the carbon-coated surface will be wet by molten silicon). The substrate 10 has been dipped into molten silicon and is being withdrawn upwardly at a rate V. On the carbon-coated surface 11 a silicon coating 12 grows as the substrate is being withdrawn upwardly at a rate V. On the carbon coated surface 11 a silicon coating 12 grows as the substrate is withdrawn from the silicon melt. The molten silicon is drawn up into a meniscus 13 at the carbon coated surface 11 and the crystallization of the silicon onto the substrate occurs in this meniscus at a liquid-solid interface 14.

Figure 1A:
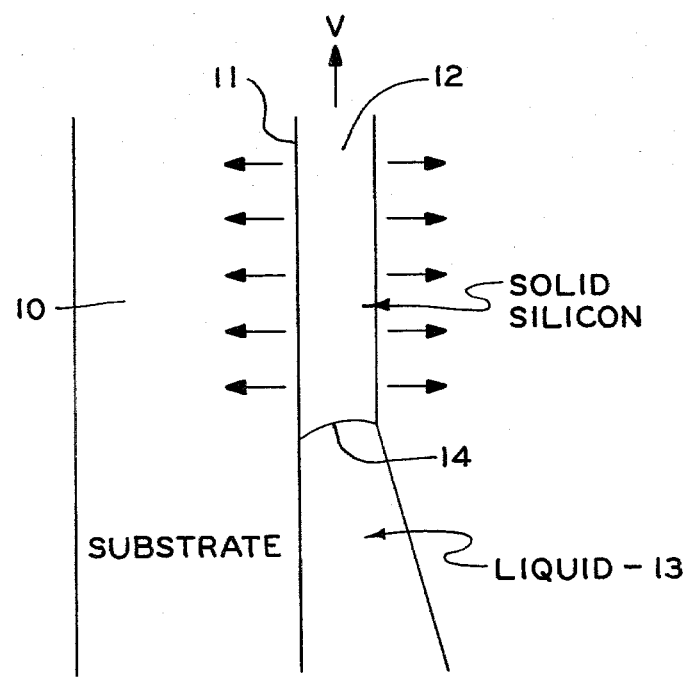
FIG. 1a is an enlargement of a portion of FIG. 1.

FIG. 1a is an enlargement of the portion of FIG. 1 in the area of the liquid-solid interface 14 and also shows heat flow patterns from the solid silicon 12 by the use of a series of arrows. FIG. 1a shows that the solidification takes place at a liquid-solid interface 14 in which the interface angle is close to 90° to the surface 11. This 90° case is called the symmetric mode of growth. In this mode the radiation environment is essentially symmetric and thus heat is removed from the silicon approximately equally on both sides of the silicon sheets, and growth occurs in the symmetric mode.

ASYMMETRIC GROWTH

Figure 2:
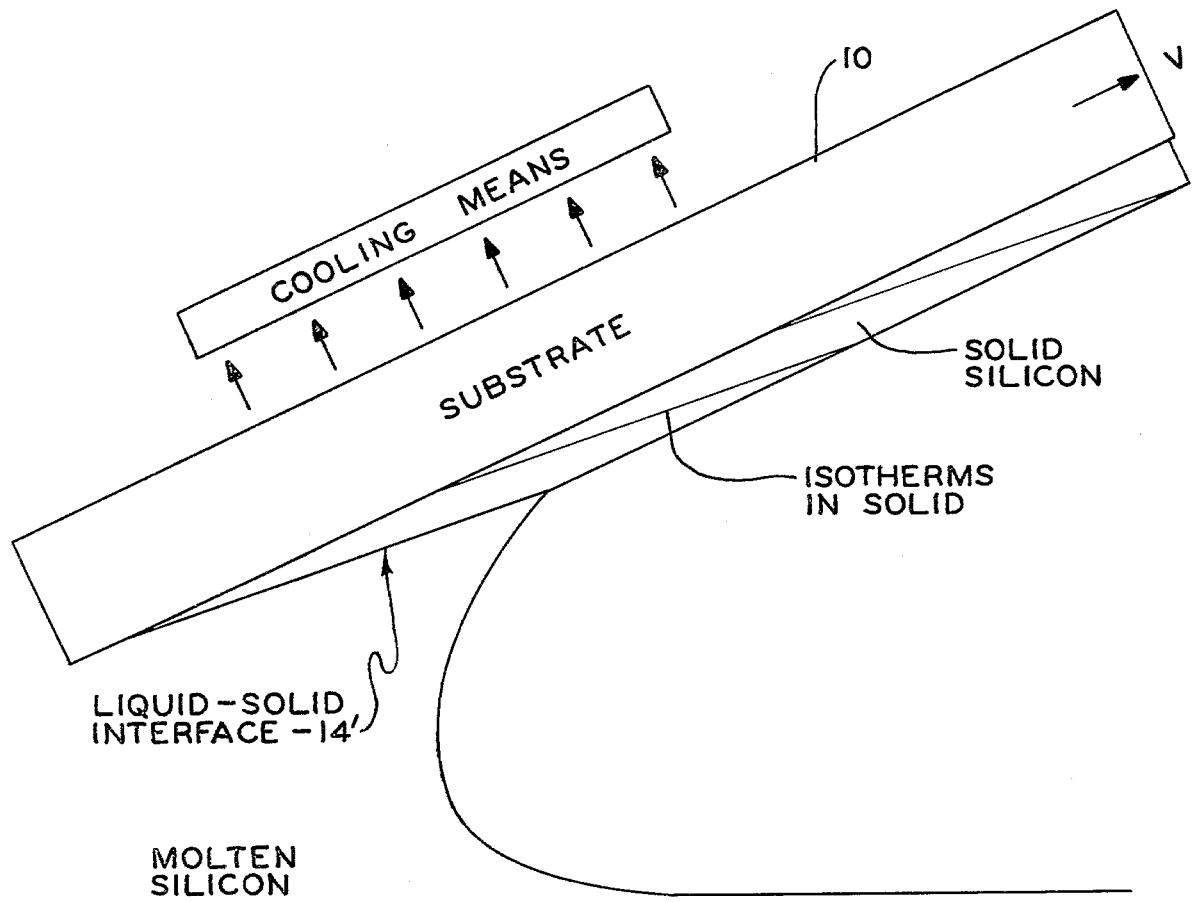
FIG. 2 shows diagrammatically the basic concept of the asymmetric cold substrate growth.

Referring now to FIG. 2 the basic concept of the cold substrate growth of sheet silicon is shown. By the use of the term "cold substrate" herein is meant that the temperature of the substrate on the region where the silicon film is growing is below the freezing point of silicon by a few degrees, say 5° or 10° C. so that the molten silicon will rapidly freeze as it contacts the colder substrate. Thus in FIG. 2 molten silicon is brought into contact with a moving ceramic substrate 10 that is inclined at an angle as shown. The substrate 10 is cooled below the temperature of the melt at the area of and during the growing of the silicon coating so that the liquid-solid interface 14' is nearly parallel to the substrate, but inclined at a small angle to the substrate surface so the first liquid to solidify solidifies on the substrate. The silicon layer is homogeneous, that is, the silicon grows from the previously solidified silicon.

An important advantage of cold substrate growth is the minimized contact time between the substrate and the melt. If the substrate temperature where the substrate first contacts the melt is below the freezing point of silicon it will cause the silicon to freeze immediately. This will cause the liquid-solid interface at the very tip of the solid silicon to curve toward the substrate. If this curvature is not excessive, no heterogeneous nucleation will occur, so that large grains will result. The contact time in this case approaches zero, so that in the limit, no impurities can enter the melt from the substrate except by diffusing through the solidified silicon. Thus higher purity silicon can be produced, leading to higher efficiency solar cells. It should be pointed out, that even though the LSI at the tip curves toward the substrate, most of the LSI is at the cold substrate angle, as defined by Eq. (6) below.

An advantage of this geometry with respect to speed is that the growth interface is growing at a velocity V which is much lower than the pull rate V. This is possible because the growth surface is much larger than the layer crossectional area.

A related advantage of assymetric growth such as described lies in the fact that the latent heat of fusion can be removed more readily. Heat conduction is basically perpendicular to the isotherms. The isotherms are parallel to the liquid-solid interface as is shown in detail in FIG. 2. Thus the heat need be conducted essentially the thickness of the silicon to the substrate. This improved heat dissipation makes possible an increased growth speed. The angle the substrate makes with the surface of the melt and the angle the isotherm makes with the substrate both preferably should be smaller than that represented in FIG. 2 of the drawing.

Figure 3:
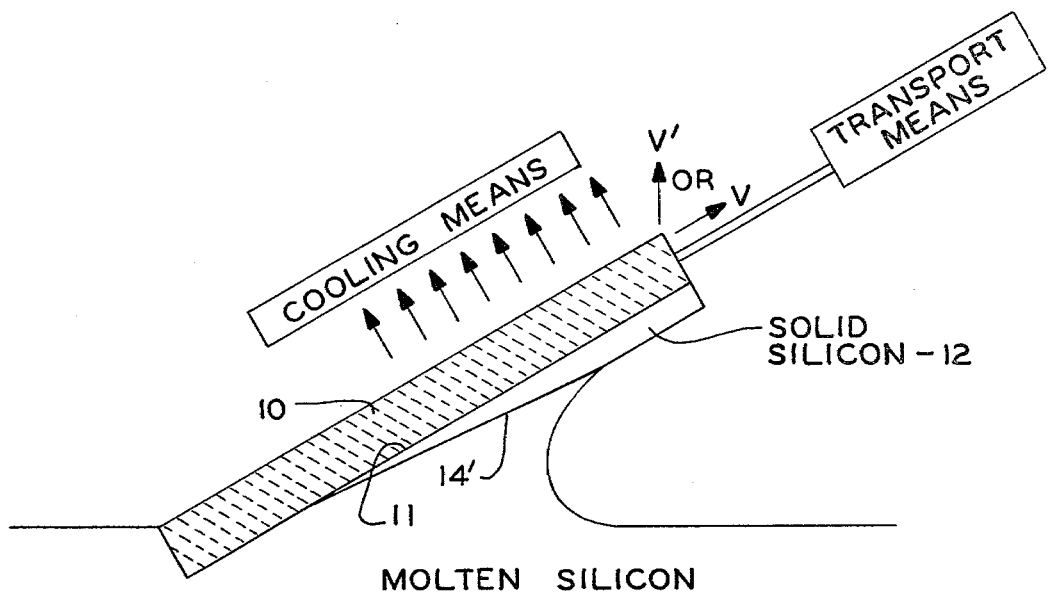
FIG. 3 shows one embodiment of asymmetrical polycrystalline silicon layer cold substrate growth by non-vertical dip coating.

Several alternative embodiments of the cold substrate asymmetric growth are shown in the next two figures of the drawing. Referring now to FIG. 3 there is disclosed a non-vertical dip-coating embodiment in which the ceramic substrate 10 is immersed in molten silicon. In withdrawing the substrate from the silicon melt, by transport means shown in block diagram form, the direction of the velocity may be along the length of the substrate as shown by V or may be vertical as shown V'. An asymmetric growth occurs on the carbon-coated substrate surface 11 providing a polycrystalline silicon layer 12 having the properties described in FIG. 2. The asymmetric liquid-solid interface 14' can occur in this embodiment because the substrate in the region of interface 14' is cooled from above so that the heat flow (latent heat of freezing) from the silicon layer is basically upwardly to and through the substrate to cooling means, such as a cooling shoe. It is also to be understood that the same cold substrate asymmetric growth concept may be implemented in a vertical dip coating configuration by having a substrate cooling shoe located near the back side of the emerging substrate. This cooling may be by radiation or convection to a cooler object. Forced convection such as a jet of helium may be utilized if desired.

Figure 4:
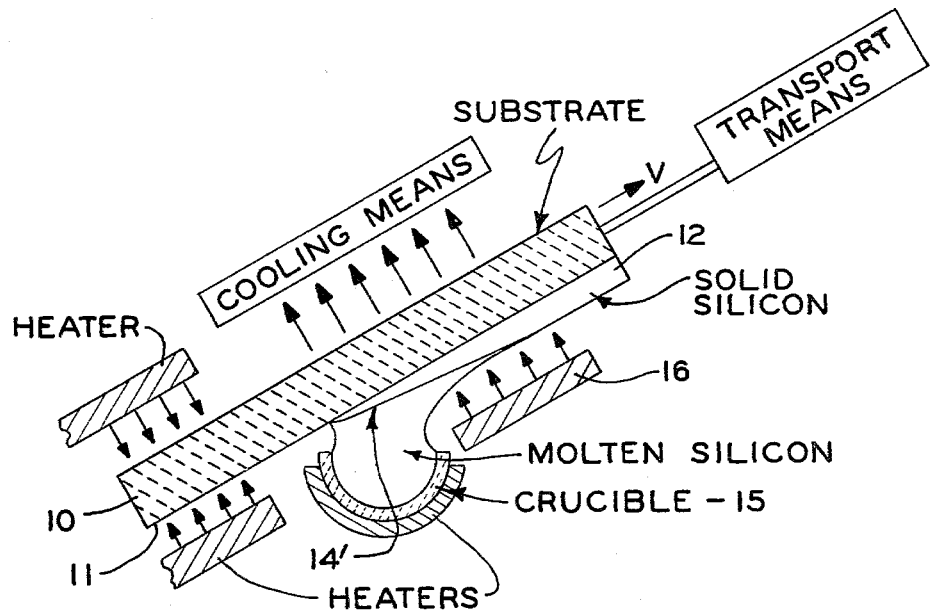
FIG. 4 shows another embodiment of asymmetrical silicon layer cold substrate growth.

Referring now to FIG. 4, another embodiment of cold substrate asymmetrical growth is shown in which the substrate 10 with carbon-coated surface 11 facing downwardly is supported and moved, by transport apparatus shown, (and with the direction of the velocity V indicated by an arrow) over the top surface of the molten silicon. The silicon melt is shown in an elongated crucible 15 containing a protruding meniscus of the molten silicon. The meniscus of silicon makes contact with surface 11 of the moving substrate to grow the silicon layer 12 on the substrate. In this embodiment a substrate cooling is shown as occurring above the substrate 10 and extending to a point near the solidification interface to provide a cold substrate at the area of liquid-solid interface 14' so that the latent heat of freezing flows upwardly from the silicon to and through the substrate as indicated by the upward arrows above the substrate. Thus with the interface surface of the silicon layer adjacent the cold substrate being at the lowest temperature, solidification begins at the silicon interface surface and proceeds away from the substrate.

As in dip-coating, the thickness of the silicon layer achieved in the inclined horizontal coating procedure of FIG. 4 is dependent upon the rate at which the heat of fusion is extracted from the layer and is dependent upon the velocity at which the layer is growing. If thermal conditions within the solidification zone are such that the liquid-solid interface lies in a plane perpendicular to the surface of the substrate (as described in FIG. 1a), the growth rate of the crystalline layer and throughput rate of the coated layer are identical. The angle of the solidification front can however, as herein described, be tilted to be nearly parallel to the substrate, by altering thermal conditions in the solidification zone to incorporate large asymmetry in the heat flow from the two sides of the silicon layer during growth. Heater 16 together with cooling means such as a cooling shoe 18 provides this altered thermal condition so that the latent heat of fusion is removed by conduction to the substrate (cold substrate growth). Whenever the plane of this front is substantially away from the normal to the substrate, the throughput rate will be substantially greater than the crystalline growth rate.

ANALYTICAL CONSIDERATION OF ASYMMETRIC GROWTH

Figure 5:
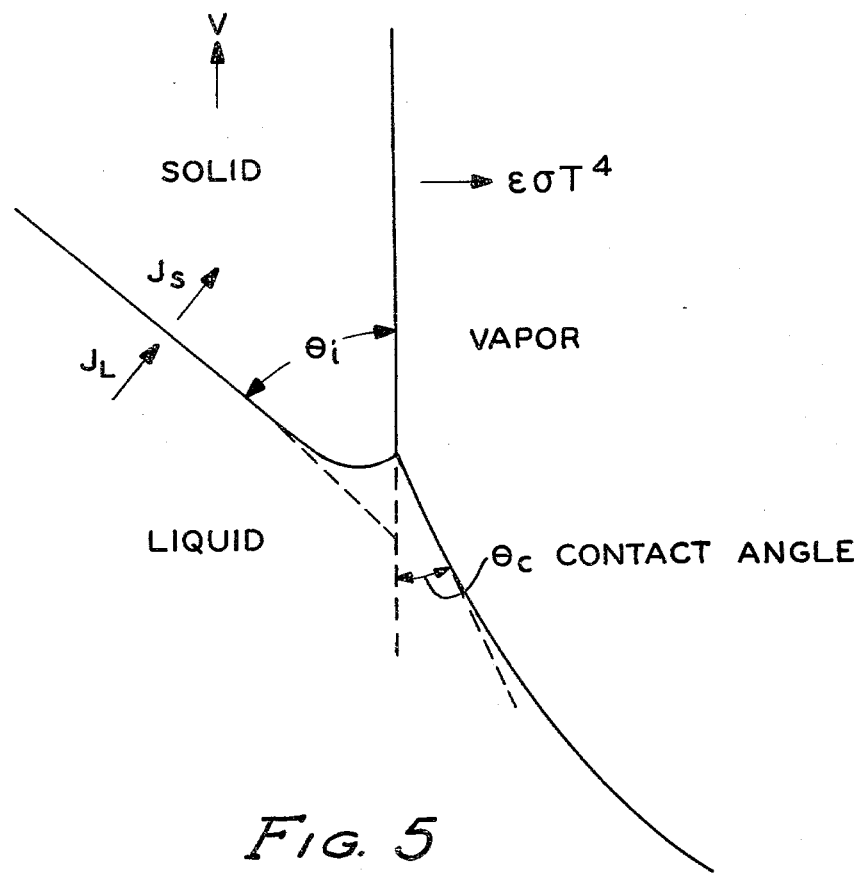
FIG. 5 is a drawing of liquid-solid-vapor configuration in the vicinity of the trijunction between the three phases; and, FIG. 6 shows the advance of the solid-liquid interface.

The purpose of this section is to present a simplified thermal analysis which shows that the asymmetric "cold substrate" type of growth is quite distinct from the usual symmetric type growth. The analysis is based on the following assumptions:

1. The liquid-solid interface (LSI) is an isotherm. The temperature of the isotherm is defined to be $T_F$, the freezing temperature.
2. The LSI is essentially planar, having a large radius of curvature (R > 1 cm). There could be a small region (on the order of microns) near the trijunction where curvature can exist as illustrated in FIG. 5.
3. The pulling velocity v (with which the growing layer is withdrawn from melt in the region of interest for sheet growth) is greater than 0.05 cm/sec.
4. The heat flux density $J_L$ in the liquid is small compared to that in the solid $J_s$.
5. Heat transfer from the free surface is dominated by radiation according to the Stefan-Boltzman law: $\epsilon \sigma T^4$ The first part of the thermal analysis argument is to derive the boundary condition at the liquid-solid interface. This condition is well known, but is derived here for continuity of the analysis.

Figure 6:
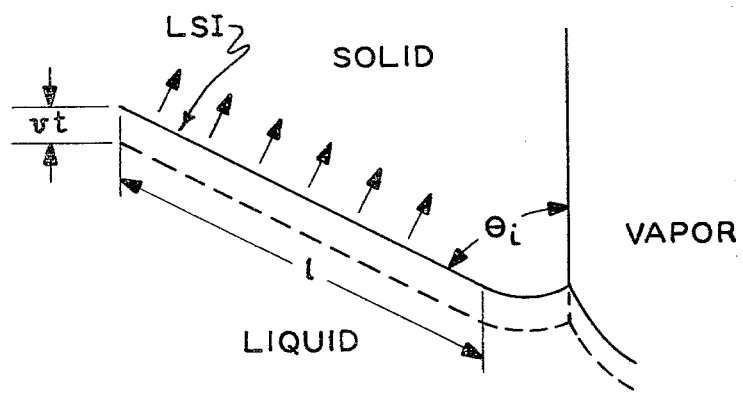

FIG. 6 shows the advance of the liquid-solid interface during growth. In a time t the solid advances a distance vt. The volume solidified in time t is (vt1w) sin $\theta_i$, where w is the width of the sheet (perpendicular to the figure). The heat energy liberated is ($\rho$Lvt 1w) sin $\theta_i$. This heat must be equal to the heat carried away by conduction, ($J_s - J_L$) 1wt. Equating the two expressions gives $$J_s = J_L + \rho L v \sin \theta_i. \tag{1}$$

In the high speed limit $J_L$ will be negligible compared to $J_s$ (assumption 4 above), giving $$J_s = \rho L v \sin \theta_i. \tag{2}$$

Since the liquid-solid interface is an isotherm (assumption 1) the heat flow is perpendicular to it. The horizontal component is $J_L \cos \theta_i$, which must equal the heat loss at the boundary: $\epsilon \sigma T_F^4$, by assumption 5. In this consideration the emissivity $\epsilon$ is that of the ceramic $\epsilon_c$ in contrast with that of the silicon. Thus:

$$\sigma L \nu \sin \theta_i \cos \theta_i = \epsilon \sigma T^4 \quad (3)$$

where T is the freezing temperature of silicon (1685° K.).

The value of $\theta_i$ is then given by $$\sin \theta_i \cos \theta_i = (\epsilon \sigma T_F^4)/(\rho L \nu) = \delta \quad (4)$$

With a value of $\nu = 0.05$ cm/sec. (assumption 3) the numerical value of $\delta$ is about 0.1, so that
$$\sin \theta_i \cos \theta_i = \tfrac{1}{2} \sin 2\theta_i = \delta < 0.1 \quad (5)$$

When the value of $\theta_i$ is greater than 90°, heat flows toward the substrate. If $\delta_c$ is used to denote $\epsilon_c \sigma T_F^4/L\nu$ this equation for $\theta_i$ has two solutions: $\theta_i = 90° - \delta_c$ and $\theta_i = 180° - \delta_c$, corresponding to vertical type growth and cold substrate growth, respectively:

$$\theta_i = \begin{cases} 180° - \delta_c \text{ Cold substrate-type growth} \\ 90° - \delta_c \text{ Symmetrical-type growth} \end{cases} \quad (6)$$

Symmetrical type growth would take place at values less than the limit given because heat would be removed from both sides of the silicon. In equation (6) $\delta_c$ is understood to be in radians. For example, $\delta = 0.1$ radians corresponds to $\delta = 5.7°$, and $\theta_i = 174.3°$ would be the angle of the liquid-solid interface at the trijunction.

The embodiments of the invention in which an exclusive property or right is claimed are defined as follows:

1. An improved method for growing a layer of polycrystalline silicon on a substrate from a source of molten silicon comprising the steps of:
    providing a source of molten silicon;
    providing a substrate to grow a silicon layer on;
    transporting the substrate with respect to and proximate the molten silicon whereby contact is made between the molten silicon and the substrate surface causing a silicon layer to grow on said surface; and
    tilting the solid-liquid interface of the growing silicon layer to be substantially parallel with the substrate by the step of cooling the substrate from the non-coated side to provide a unidirectional heat flow from the silicon layer to the cooled substrate.

2. The method according to claim 1 in which the substrate to grow the silicon layer on is a ceramic and in which the ceramic substrate has a surface thereof carbon-coated where it is desired that the silicon layer grow.

3. The method according to claim 2 and wherein the step of transporting the substrate further comprises:
    immersing the substrate in molten silicon;
    removing the substrate from the melt in a non vertical position with the carbon coated surface of the substrate facing downwardly;
    thereby growing a silicon layer on the emerging carbon coated surface of the substrate.

4. The method according to claim 2 wherein the step of providing a source of molten silicon further comprises:
    providing an elongated crucible for containing the molten silicon;
    maintaining the level in the crucible such that the silicon surface rises up from the crucible surface in a convex meniscus;
and wherein the step of transporting further comprises:
    supporting the substrate with the carbon coated surface facing downwardly;
    and traversing the downwardly facing surface of the substrate over and across the surface of the molten silicon meniscus with the surface making contact with the silicon meniscus as the substrate traverses to grow a silicon layer as the carbonized surface emerges from contact with the silicon meniscus.

5. The method according to claim 1 wherein the step of providing a source of molten silicon further comprises:
    providing an elongated crucible for containing the molten silicon;
    maintaining the level in the crucible such that the silicon surface rises up from the crucible surface in a convex meniscus;
and wherein the step of transporting further comprises:
    supporting the substrate with the surface to be coated facing downwardly;
    and traversing the downwardly facing surface of the substrate over and across the surface of the molten silicon meniscus with the surface making contact with the silicon meniscus as the substrate traverses to grow a silicon layer as the surface emerges from contact with the silicon meniscus.

6. An improved method for growing a layer of polycrystalline silicon on a substrate from a source of molten silicon comprising the steps of:
    providing a source of molten silicon;
    providing a substrate to grow a silicon layer on said substrate having a surface area thereof of carbon where it is desired that the silicon layer grow;
    transporting the substrate with respect to and proximate the molten silicon whereby contact is made between the molten silicon and the carbon surface of the substrate causing a silicon layer to grow on said surface; and
    cooling to a temperature lower than the freezing point of silicon an area of the substrate in the region of silicon solidification from the non-coated side to provide unidirectional heat flow from the silicon layer to the cooled substrate whereby because of the unidirectional heat flow pattern, solidification of the silicon layer commences at the substrate surface and progresses outwardly.

* * * * *